United States Patent [19]

Irino

[11] Patent Number: 5,910,677
[45] Date of Patent: Jun. 8, 1999

[54] SEMICONDUCTOR DEVICE HAVING A PROTECTION CIRCUIT

[75] Inventor: Hitoshi Irino, Tokyo, Japan

[73] Assignee: NEC Corporation, Tokyo, Japan

[21] Appl. No.: 08/997,093

[22] Filed: Dec. 23, 1997

[30] Foreign Application Priority Data

Dec. 27, 1996 [JP] Japan ................................ 8-349246

[51] Int. Cl.$^6$ .............................................. H01L 29/76
[52] U.S. Cl. .................... 257/393; 257/394; 257/245; 257/309; 257/317; 257/349; 257/355; 257/356; 257/360
[58] Field of Search .................................. 257/393, 394, 257/213, 245, 275, 288, 307, 309, 317, 349, 355, 356, 360

[56] References Cited

U.S. PATENT DOCUMENTS

| | | | |
|---|---|---|---|
| 5,477,407 | 12/1995 | Kobayashi et al. | 257/355 |
| 5,610,427 | 3/1997 | Shida | 257/356 |
| 5,777,366 | 7/1998 | Contiero et al. | 257/355 |
| 5,838,043 | 11/1998 | Yuan | 257/356 |

FOREIGN PATENT DOCUMENTS 7-74353  3/1995  Japan .

OTHER PUBLICATIONS

Polgreen et al., Improving the ESD Failure Threshold of Silicided n–MOS Output Transistors by Ensuring Uniform Current Flow. *IEEE Transaction on Electron Devices* 39–379388 (1992).

*Primary Examiner*—Carl Whitehead, Jr.
*Attorney, Agent, or Firm*—Foley & Lardner

[57] ABSTRACT

Protection circuits for preventing an internal circuit on a semiconductor substrate from destroying due to an excess voltage are formed on the output end and input end of an internal circuit. The protection circuit on the input end has a gate electrode comprised of a band-like conductive film. This gate electrode is grounded and has a shape zigzagging in a waveform with crests and troughs alternately appearing in a planar view. A drain diffusion layer connected to an output end of the internal circuit is formed in one of two diffusion regions of the surface of the semiconductor substrate that are defined by the gate electrode, and a source diffusion layer grounded is formed in the other region. The source diffusion layer and the drain diffusion layer are formed integral with each other, so that the protection circuit on the input end is substantially constituted of one buffer transistor.

15 Claims, 7 Drawing Sheets

SEMICONDUCTOR DEVICE HAVING A PROTECTION CIRCUIT

BACKGROUND OF THE INVENTION

1. Field of the Invention

The present invention relates to a semiconductor device having a protection circuit for preventing an internal circuit from destroying due to an excess voltage, and, more particularly, to a semiconductor device having a protection circuit capable of improving a protective withstand voltage.

2. Description of the Related Art

An input end and output end of an internal circuit in a semiconductor device are respectively provided with an input protection circuit and an output protection circuit for preventing said internal circuit from destroying due to an excess voltage. Recently, a semiconductor device which is designed for higher integration and higher density by reducing the occupying area of a protection circuit has been proposed by Thomas L. Polgreen et al. in "Improving the ESD Failure Threshold of Silicided n-MOS Output Transistors by Ensuring Uniform Current Flow," IEEE TRANSACTIONS ON ELECTRON DEVICES, VOL 39, No. 2, February 1992, pp. 382–384.

FIG. 1A is a circuit diagram showing a conventional input protection circuit. FIG. 1B is a circuit diagram showing a conventional output protection circuit. As shown in FIG. 1A, the input protection circuit located on the input end of an internal circuit has a P-channel MOS transistor 42 and an N-channel MOS transistor 43 connected in series. A line 61 is connected between the transistor 42 and the transistor 43. One end of the line 61 is connected to a pad electrode 41 and the other end of the line 61 is connected via an inverter 44 to a buffer output end 45.

As shown in FIG. 1B, the output protection circuit located on the output end of the internal circuit has a P-channel MOS transistor 47 and an N-channel MOS transistor 48 connected in series. A line 62 is connected between the transistors 47 and 48 to which a pad electrode 46 is connected via the line 62.

FIG. 2A is an exemplary diagram showing the N-channel MOS transistor 43 in the input protection circuit shown in FIG. 1A. FIG. 2B is an exemplary diagram showing the N-channel MOS transistor 48 in the output protection circuit shown in FIG. 1B. FIG. 3 is an exemplary diagram depicting a cross section along the line IIA—IIA in FIG. 2A. As shown in FIGS. 2A and 3, a plurality of gate electrodes 51 extending in parallel are formed on the semiconductor substrate 56. Drain diffusion layers 52 and source diffusion layers 53 are alternately formed at the surface of the semiconductor substrate 56 between those gate electrodes 51 and on both sides of the gate electrodes 51.

Drain electrodes 52a and source electrodes 53a, extending in parallel to the gate electrodes 51, are formed via insulator films (not shown) on the drain diffusion layers 52 and the source diffusion layers 53. Those electrodes 52a and 53a are electrically connected to the associated drain diffusion layers 52 and source diffusion layers 53 via contacts 54, which are selectively formed at the insulator films. Further, the drain electrodes 52a are connected in parallel to the line 61, and the pad electrode 41 is connected to one end of the line 61 with the buffer output end 45 connected to the other end of the line 61. Furthermore, the source electrodes 53a and the gate electrodes 51 are set to a ground (GND) potential 55.

A P type guard ring layer 58 which is set to the GND potential is formed at the surface of the semiconductor substrate 56 at such a position as to surround those MOS transistors, with field oxide films 57 formed at both sides of this guard ring layer 58.

As shown in FIG. 2B, the N-channel MOS transistor 48 in the output protection circuit has the same structure as the N-channel MOS transistor 43 of the input protection circuit.

In the conventional protection circuits, the gate width of an MOS transistor which is used as a buffer transistor is normally about 400 μm, significantly larger than the gate width of MOS transistors of the internal circuit. The large gate width is for discharging a large current of about 1 A, applied to the pad, to the GND potential.

In the prior art illustrated in FIGS. 2A, 2B and 3, the protection circuit is not comprised of a single transistor, but has a plurality of transistors connected in parallel so that the substantial gate width of the whole transistors becomes about 400 μm. The thus designed protection circuit can make its occupying area smaller than that of the protection circuit, which has a single MOS transistor with the same gate width. This can accomplish high integration and high density of a semiconductor device.

FIG. 4 is a graph showing the snapback characteristic of a buffer transistor with the input current plotted on the vertical scale and the input voltage plotted on the horizontal scale. It is to be noted that a solid line 71 in the figure shows the snapback characteristic of a silicided device while a broken line 72 in the figure shows the snapback characteristic of an unsilicided device. As shown in FIGS. 3 and 4, the input potential Vin to the pad electrode 41 rises to a potential V1 and then becomes a breakdown mode in the area of the drain diffusion layer 52 directly below the gate electrode 51. After dropping to a potential Vsb, this input potential Vin rises again. The status of the transistor at this time is called a snapback state.

This snapback state occurs as parasitic bipolar transistors TrA and TrB shown in FIG. 3 are turned on. That is, impact ionization occurs directly under the drain diffusion layer 52 at the electrostatic destruction time and multiple holes are generated there, raising the potential of the semiconductor substrate 56. Thereafter, multiple electrons are diffused into the semiconductor substrate 56 from the source diffusion layer 53, so that the parasitic bipolar transistors TrA and TrB are turned on by this diffusion current. Since setting the buffer transistor into the snapback state can permit charges in the pad electrode 41 to be discharged efficiently, so that the performance of protecting the internal circuit can be enhanced.

Recently, a device whose diffusion layer has a silicided surface has been employed to increase the operational speed of a semiconductor device. The electrostatic destruction voltage of a device whose diffusion layer has a silicided surface becomes, for example, a voltage Vx1s as indicated by the solid line 71 while the electrostatic destruction voltage of a device whose diffusion layer has an unsilicided surface becomes, for example, a voltage Vx1 as indicated by the broken line 72.

When the N-channel MOS transistors 43 and 48 are formed in the layouts shown in FIGS. 2A and 2B, however, the guard ring layer 58 around the MOS transistors makes it difficult for the substrate potential at the peripheral portion of the buffer transistor to rise. Therefore, the parasitic bipolar transistor TrA formed at the peripheral portion of the buffer transistor becomes difficult to be turned on as compared with the parasitic bipolar transistor TrB formed at the center portion of the buffer transistor. This makes the peripheral portion of the buffer transistor more difficult to become the snapback state than the center portion of the buffer transistor. A variation in the way of going into the snapback state present in the substrate 56 cannot efficiently protect the internal circuit for the following reasons.

Suppose that the electrostatic destructon voltage Vx1 is greater than the potential V1 (Vx1>V1) in a device whose diffusion layer has an unsilicided surface. When the pad voltage increases due to the application of a surge voltage, one of a plurality of MOS transistors connected in parallel becomes a snapback state first. Assume that this transistor is a transistor Tr1. This transistor Tr1 is most likely to trigger into snapback by a productional variation or the influence or the like of the guard ring layer 58. When the transistor Tr1 goes to the snapback state, the pad voltage is clamped to a potential Vsb. In a device of the 0.35 µm rule, for example, the potential V1 is normally about 10 V, whereas the potential Vsb is about 6 V. It is apparent that the potential of the pad 41 drops significantly. When one transistor Tr1 gets into the snapback state, therefore, the other transistors cannot trigger into snapback.

After the transistor Tr1 triggers into snapback, the pad voltage rises again. Because the current flowing through the transistor Tr1 then has not reached the electrostatic destructon current Ix1, electrostatic destruction does not occur. When the pad voltage reaches the potential V1 thereafter, another transistor Tr2 goes into the snapback state. In this manner, the transistors sequentially trigger into snapback and all the transistors eventually go to the snapback state. Consequently, the whole transistors are discharged in the snapback state, thus ensuring a high protecting performance.

In the case of a silicided device, the above-described mechanism cannot be applied. Specifically, since the resistance of the diffusion layer of a silicided device is lower than that of an unsilicided device, the resistances of the areas equivalent to the emitter and collector of a bipolar transistor become lower. As indicated by the solid line 71 in FIG. 4, therefore, the inclination of the snapback characteristic after the transistor triggers into snapback becomes sharp. For example, the snapback resistance Rsnps of the silicided device is about 18 Ω while the snapback resistance Rsnp of the unsilicided device is about 30 Ω, showing approximately 50% of difference between those resistances. When one transistor Tr1 in the parallel-connected transistors triggers into snapback, therefore, the current flowing through the transistor Tr1 reaches the electrostatic destruction current Ix1, destroying the transistor Tr1, before the next transistor Tr2 triggers into snapback. That is, with the silicided surface of the diffusion layer, even if rectangular gate electrodes are laid out in parallel and transistors are connected in parallel as shown in FIGS. 2A and 2B, after one transistor Tr1 is operated, this transistor Tr1 is broken before another transistor triggers into snapback.

This phenomenon occurs not only in a device having a diffusion layer with a silicided surface but also in a device having a diffusion layer with an unsilicided surface. That is, with the electrostatic destruction current of the transistors being Ix2 and the electrostatic destruction voltage being Vx2, when the electrostatic destruction voltage Vx2 is smaller than the potential V1 (Vx2<V1), after one transistor Tr1 in the parallel-connected transistors triggers into snapback, the current flowing through the transistor Tr1 reaches the electrostatic destruction current Ix2, destroying the transistor Tr1, before another transistor triggers into snapback.

In view of the above, the conventional protection circuit cannot efficiently protect a circuit against an excess voltage.

SUMMARY OF THE INVENTION

Accordingly, it is an object of the present invention to provide a semiconductor device having a protection circuit whose occupying area does not become larger and which can improve a property for prevent a circuit from destroying due to an excess voltage without reducing the operational speed of a device and increasing the number of fabrication steps.

A semiconductor device having a protection circuit according to this invention comprises a substrate, an internal circuit formed at the surface of this substrate, and a protection circuit, connected to an input end of the internal circuit, for preventing the internal circuit from destroying due to an excess voltage. This protection circuit has a gate electrode formed on the substrate in a shape zigzaging in a wavelike form in a planar view and set to a ground potential, a first diffusion layer connected to the input end of the internal circuit and formed in one of two diffusion regions of the surface of the substrate, and a second diffusion layer set to the ground potential and formed in the other one of the two diffusion regions. The regions of the surface of the substrate are defined by the gate electrode. One of the first diffusion layer and the second diffusion layer is a source diffusion layer and the other is a drain diffusion layer.

According to another semiconductor device embodying this invention, the gate electrode of the protection circuit is connected to an output end of the internal circuit. An excess voltage is applied to the first diffusion layer. Further, the second diffusion layer is set to the ground potential.

It is preferable that the gate electrode should have a waveform shape having crests and troughs alternately appearing, and each of the crests and troughs is comprised of a plurality of corner portions of dull angles. It is more preferable that the crests and troughs be arcuate.

The semiconductor device according to this invention may comprise a source electrode electrically connected to the source diffusion layer and a drain electrode electrically connected to the drain diffusion layer. Further, the source electrode and the drain electrode may be formed of metal.

In a semiconductor device having another protection circuit according to this invention, the protection circuit is connected to the input end of an internal circuit. A gate electrode is set to the ground potential, and a field insulator film having a shape zigzagging like the gate electrode is formed under the gate electrode. The field insulator film defines a first diffusion layer and a second diffusion layer.

The gate electrode may be formed integral with a source electrode to be connected to the source diffusion layer or with a drain electrode to be connected to the drain diffusion layer.

Conventionally, the protection circuit is comprised of a plurality of buffer transistors, so that when one buffer transistor triggers into snapback, a burden at the time of discharging the applied excess voltage is concentrated on the buffer transistor, destroying that transistor. According to this invention, however, the gate electrode of a buffer transistor which constitutes the protection circuit is so shaped as to be zigzagged in a single waveform in a planar view, and the source diffusion layer and drain diffusion layer are each formed as a single diffusion layer region, so that the applied excess voltage is discharged by the entire buffer transistors. It is therefore possible to prevent the load from being concentrated only on a predetermined transistor and to improve the performance of preventing a circuit from destroying due to the excess voltage. Since the gate electrode has a zigzagging wavelike shape in a planar view, the width and length can be changed as needed. This increases the degree of freedom for designing the layout and prevent the occupying area of the protection circuit from increasing. Further, because this invention can fabricate a protection circuit in the same fabrication steps as done in the prior art, the number of fabrication steps is not increased and a semiconductor device having a protection circuit with a large current driving performance can be obtained without reducing the operational speed.

DETAILED DESCRIPTION OF THE PREFERRED EMBODIMENTS

Figure 1A:
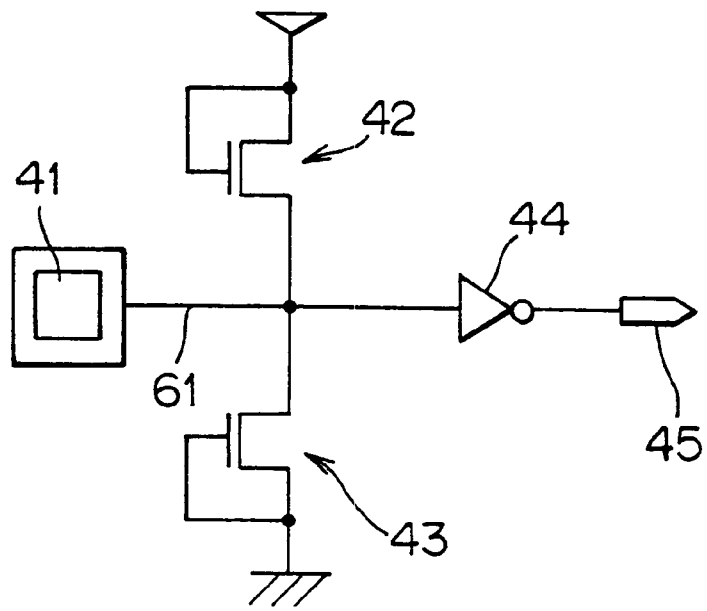
FIG. 1A is a circuit diagram showing a conventional input protection circuit.
Figure 1B:
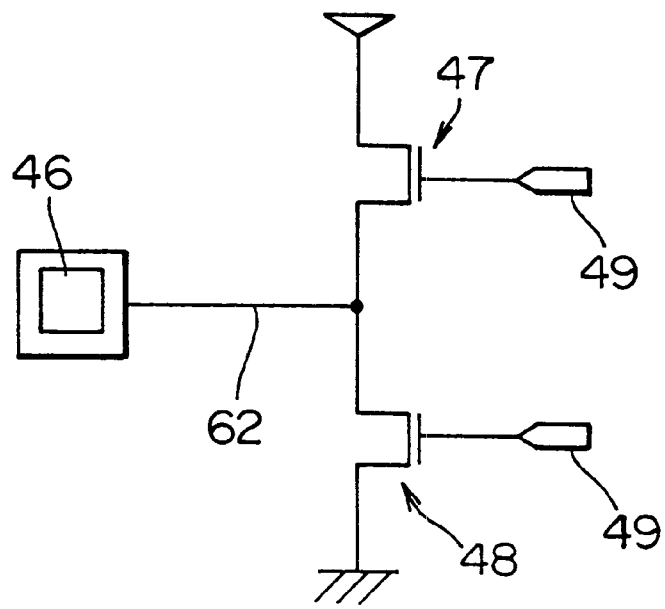
FIG. 1B is a circuit diagram showing a conventional output protection circuit.
Figure 2A:
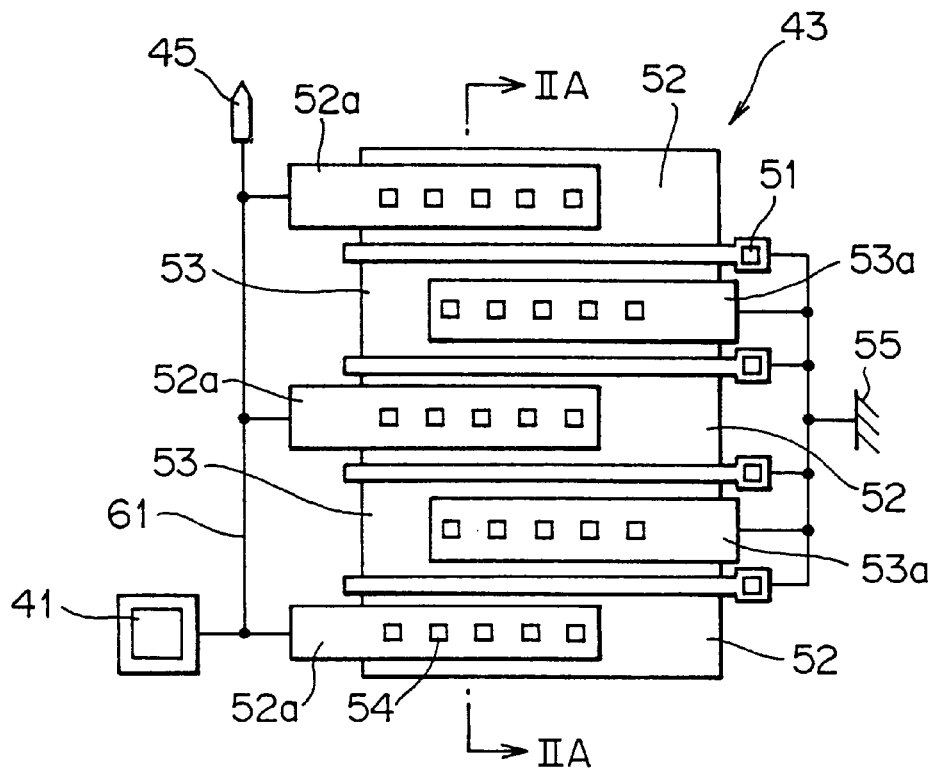
FIG. 2A is an exemplary diagram showing an N-channel MOS transistor in the input protection circuit shown in FIG. 1A.
Figure 2B:
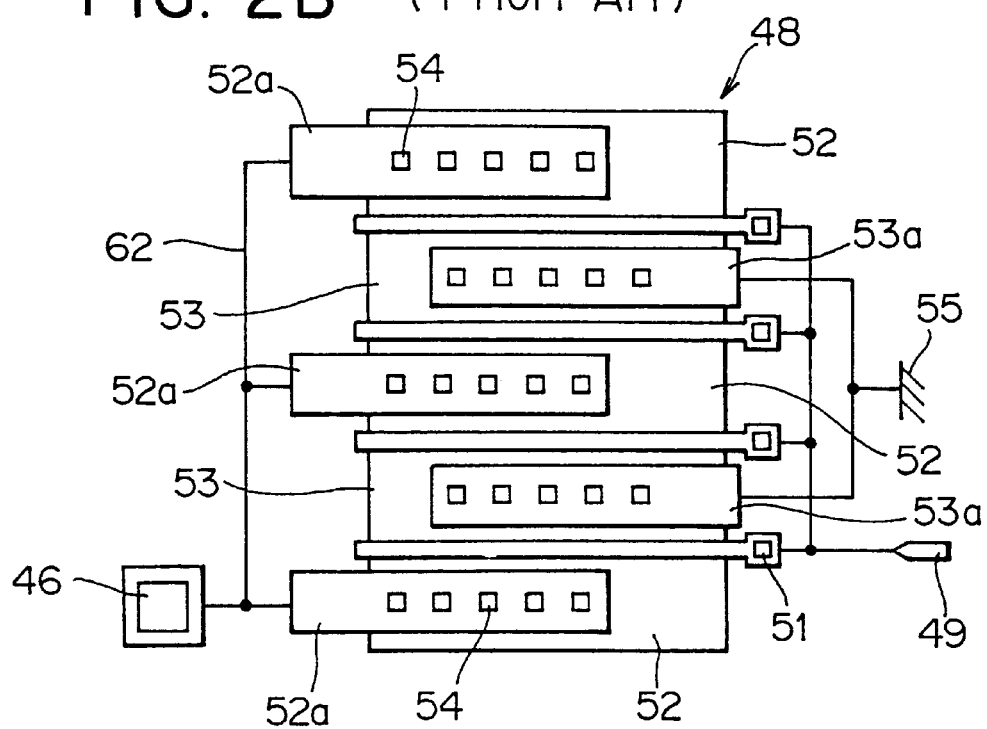
FIG. 2B is an exemplary diagram showing an N-channel MOS transistor in the output protection circuit shown in FIG. 1B.
Figure 3:
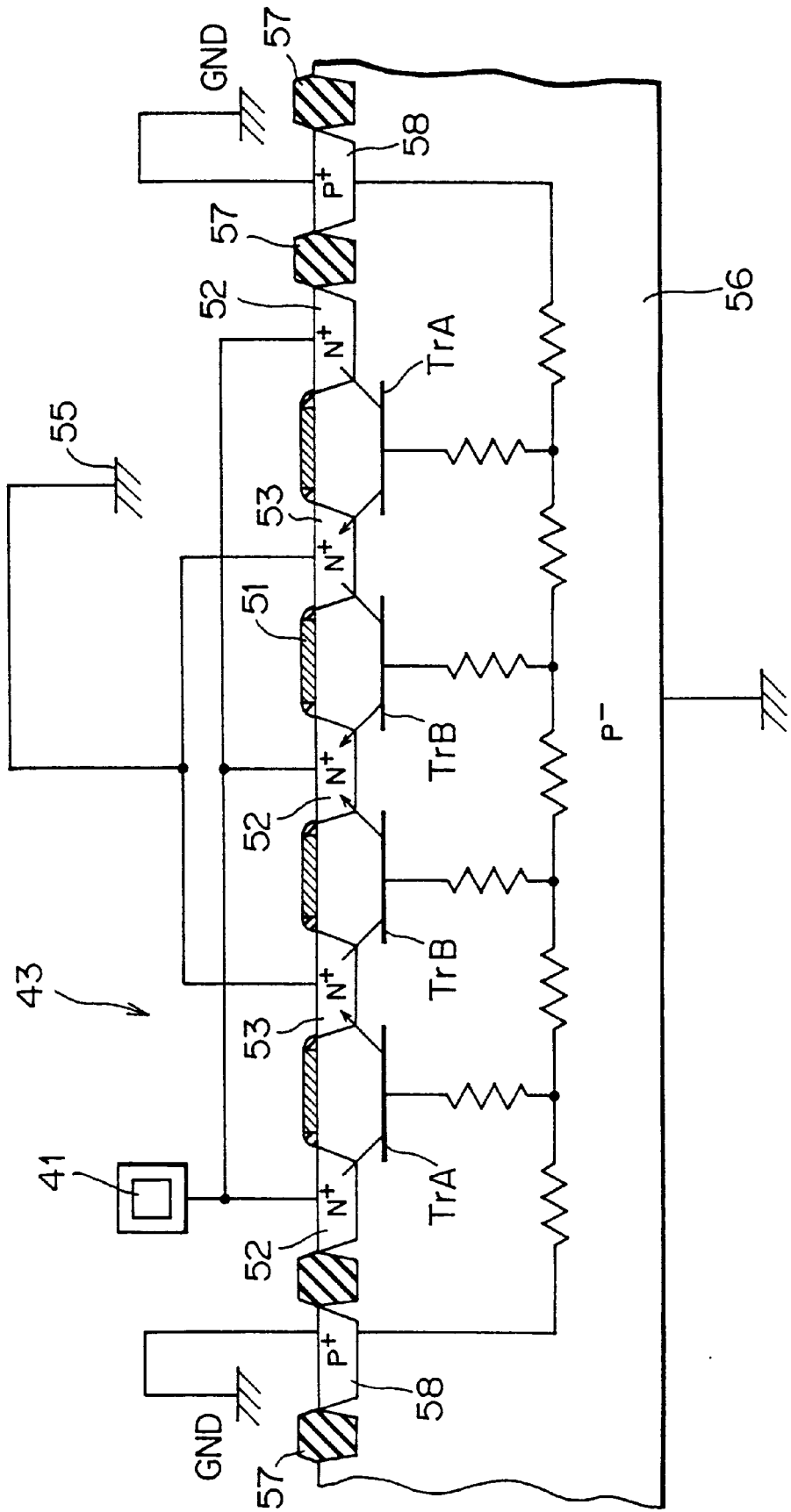
FIG. 3 is an exemplary diagram depicting a cross section along the line IIA—IIA in FIG. 2A.
Figure 4:
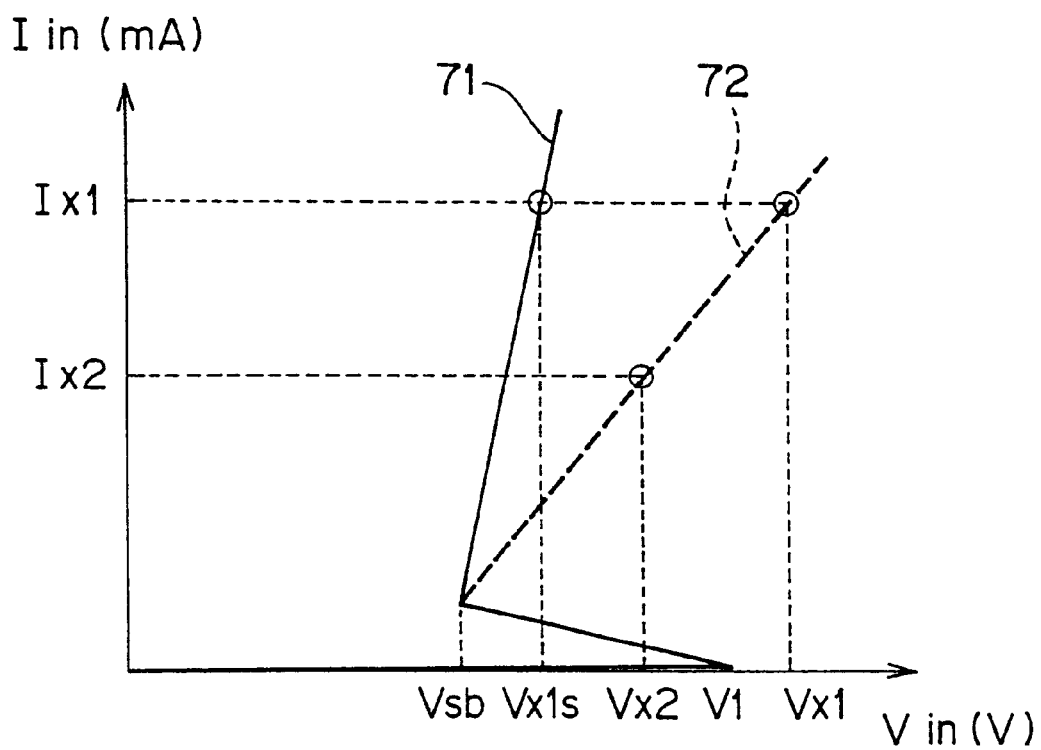
FIG. 4 is a graph showing the snapback characteristic of a buffer transistor with the input current plotted on the vertical scale and the input voltage plotted on the horizontal scale.
Figure 5A:
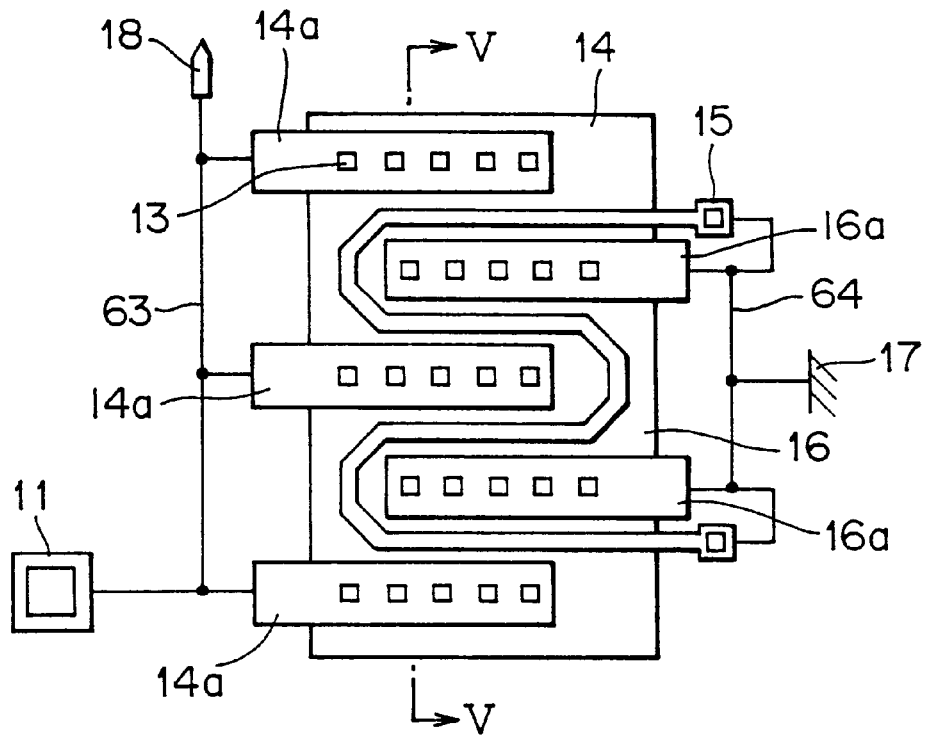
FIG. 5A is an exemplary diagram depicting an input protection circuit of a semiconductor device according to the first embodiment of this invention.
Figure 5B:
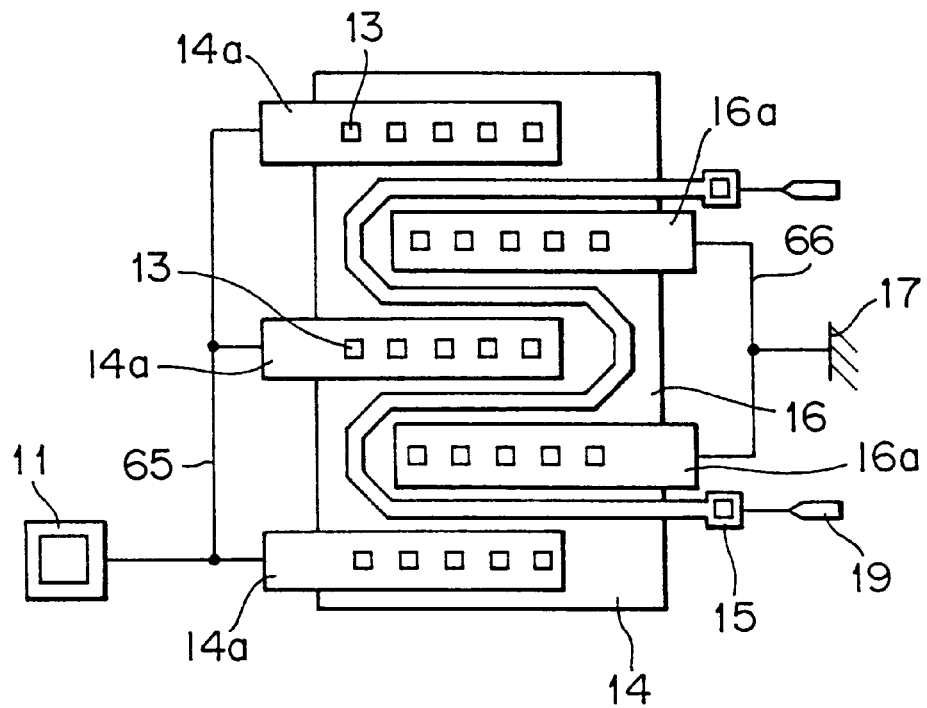
FIG. 5B is an exemplary diagram depicting an output protection circuit of the semiconductor device according to the first embodiment.

Preferred embodiments of the present invention will now be described specifically with reference to the accompanying drawings. FIG. 5A is an exemplary diagram depicting an input protection circuit of a semiconductor device according to the first embodiment of this invention, and FIG. 5B is an exemplary diagram depicting an output protection circuit of the semiconductor device according to the first embodiment. As shown in FIG. 5A, a gate electrode 15 comprised of one band-like conductive film is formed on a semiconductor substrate (not shown). This gate electrode 15 has a zigzagging wavelike shape having crests and troughs alternately appearing in a planar view on the semiconductor substrate. One drain diffusion layer 14 is formed in one of two diffusion regions of the surface of the semiconductor substrate that are defined by the gate electrode 15, and one source diffusion layer 16 is formed in the other region. That is, one region sandwiching the gate electrode 15 becomes the drain diffusion layer 14, and the other region becomes the source diffusion layer 16.

A plurality of drain electrodes 14a and a plurality of source electrodes 16a, both comprised of metal films of Al, AlSiCu, AlCu and Cu, and so forth, and having rectangular shapes extending in predetermined directions, are respectively formed on the drain diffusion layer 14 and the source diffusion layer 16. The drain electrodes 14a and the source electrodes 16a are respectively connected to the drain diffusion layer 14 and the source diffusion layer 16 via contacts 13. According to this embodiment, the gate electrode 15, the source diffusion layer 16 and the drain diffusion layer 14 are formed integral with one another, so that a protection circuit is substantially constituted of a single buffer transistor.

The drain electrodes 14a are connected to in parallel to a line 63 which has one end connected to a pad electrode 11 with the other end connected to a buffer output 18. Both ends of the gate electrode 15 and the source electrodes 16a are connected to a line 64, which is set to a ground (GND) potential 17.

As shown in FIG. 5B, the output protection circuit has the same structure as the input protection circuit shown in FIG. 5A, and the gate electrode 15, the source diffusion layer 16 and the drain diffusion layer 14 are respectively formed integrally. It is to be noted however that the drain electrodes 14a in the output protection circuit are connected to the pad electrode 11 via a line 65. The source electrodes 16a are set to the GND potential 17 via a line 66. Both ends of the gate electrode 15 are connected to a buffer input 19.

Further, a field oxide film (not shown) and a guard ring film (not shown) are formed at the surface of the substrate in the areas surrounding the buffer transistor. The cross-sectional structure along the line V—V in FIG. 5A is the same as that of the conventional protection circuit.

According to the thus constituted first embodiment, when a positive surge voltage is applied to the pad electrode 11, the buffer transistor which is constituted of the drain diffusion layer 14, the source diffusion layer 16 and the gate electrode 15 breaks down. Then, the surge voltage is discharged to the GND potential 17 via the source electrodes 16a. This protects the circuit. The operation at this time is the same as that of the prior art. Note however that the protection circuit is constituted as a single buffer transistor in this embodiment, not by connecting a plurality of transistors in parallel. That is, the drain diffusion layer 14 and the source diffusion layer 16 are formed by a single region, so that applying a surge voltage to the pad electrode 11 causes the entire buffer transistor to go to the snapback state. Unlike the conventional case where elongated gate electrodes of rectangular shapes are arranged in parallel and a plurality of transistors are connected in parallel, therefore, the order the transistors trigger into snapback does not vary. This can prevent a load, when an excess voltage is applied to the pad electrode, from being concentrated to a part of the protection circuit. This allows the surge voltage (charges) applied to the pad to be discharged efficiently, thus ensuring a high excess-voltage protecting performance.

While the withstand voltage of transistors having a gate width W of 400 $\mu$m is about 1000 V in the MIL standards in the prior art, for example, the withstand voltage of more than 4000 V for the same gate width W can be acquired in this embodiment.

Since the gate electrode 15 is so shaped as to zigzag in a waveform in a planar view in this embodiment, the occupying area of the protection circuit is hardly changed from that of the conventional protection circuit. Further, the cross-sectional structure of the protection circuit of this embodiment is substantially similar to that of the conventional protection circuit, so that the current driving performance can be maintained and the operational speed of the semiconductor device will not be slowed. In addition, there is no need for additional fabrication steps.

Figure 6:
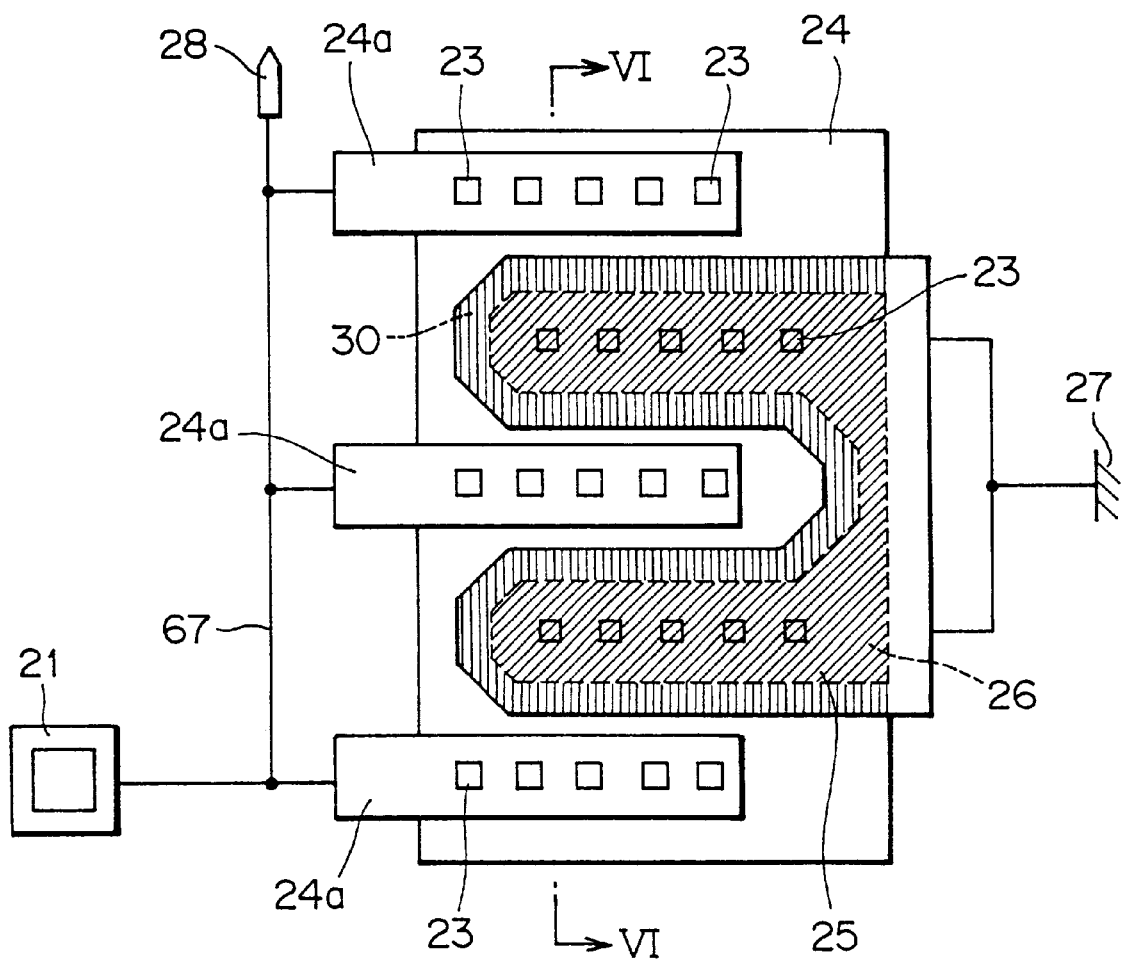
FIG. 6 is an exemplary diagram illustrating an input protection circuit of a semiconductor device according to the second embodiment of this invention.
Figure 7:
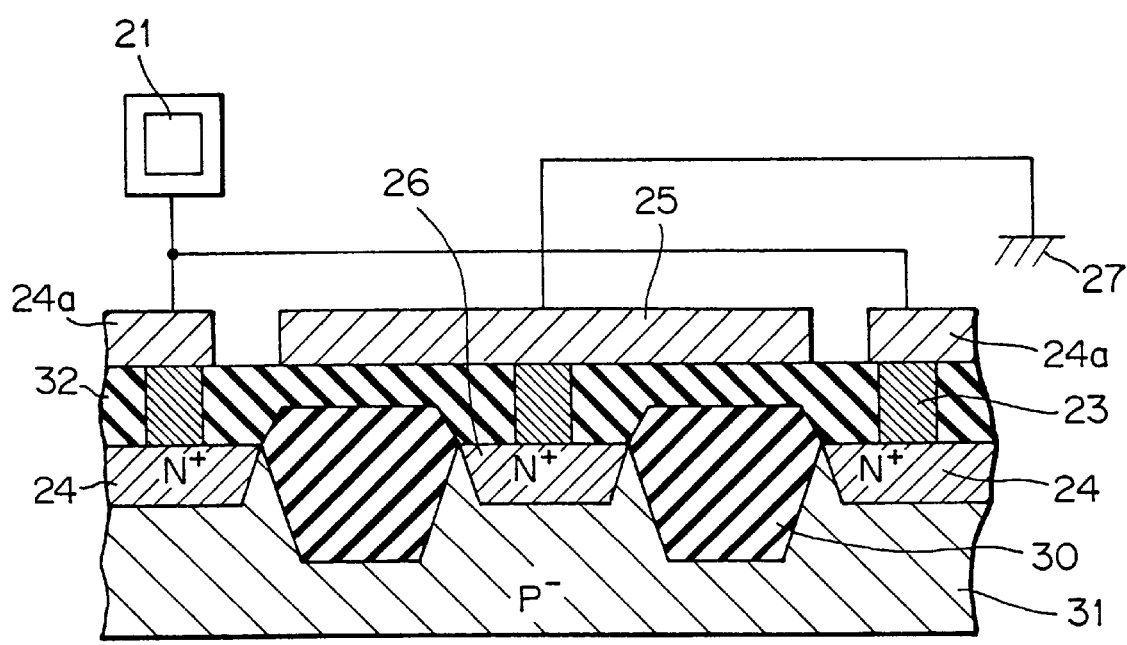
FIG. 7 is an exemplary diagram partly depicting a cross section along the line VI—VI in FIG. 6.

FIG. 6 is an exemplary diagram illustrating an input protection circuit of a semiconductor device according to the second embodiment of this invention. FIG. 7 is an exemplary diagram partly depicting a cross section along the line VI—VI in FIG. 6. In this embodiment, a field transistor is used as a buffer transistor of the protection circuit. As shown in FIGS. 6 and 7, a field oxide film 30 for defining the surface of the semiconductor substrate 31 is formed at the surface of the semiconductor substrate 31. This field oxide film 30 has a zigzagging wave-like shape with crests and troughs alternately appearing in a planar view. The drain diffusion layer 24 is formed in one of two diffusion regions of the surface of the semiconductor substrate 31 that are defined by the field oxide film 30, and the source diffusion layer 26 is formed in the other region. That is, one region sandwiching the field oxide film 30 becomes the drain diffusion layer 24, and the other region becomes the source diffusion layer 26. In FIG. 6, a vertically hatched region indicates the field oxide film 30, while the source diffusion layer 26 is indicated by an obliquely hatched region.

An interlayer insulator film 32 is formed entirely on the semiconductor substrate 31. Further, a metal electrode 25 of Al, AlSiCu, AlCu and Cu, and so forth as the source electrode and the gate electrode is formed on the interlayer insulator film 32 on the source diffusion layer 26 and the field oxide film 30. A plurality of drain electrodes 24a comprised of rectangular metal films extending in predetermined directions are formed on the interlayer insulator film 32 on the drain diffusion layer 24. The metal electrode 25 is connected to the source diffusion layer 26 via contacts 23 provided on the interlayer insulator film 32, and the drain electrodes 24a are connected to the drain diffusion layer 24 via other contacts 23 provided on the interlayer insulator film 32. According to the second embodiment, as apparent from the above, the metal electrode 25 which becomes the gate electrode and the source electrode, the source diffusion layer 26 and the drain diffusion layer 24 are formed integral with one another, so that the protection circuit is comprised substantially of one buffer transistor.

Further, the drain electrodes 24a are connected in parallel to a line 67 which has one end connected to a pad electrode 21 and the other connected to a buffer output 28. The metal electrode 25 is set to a GND potential 27.

Even in the thus constituted second embodiment, like the first embodiment, a parasitic bipolar transistor is comprised of the field transistor, which constitutes the protection circuit. Since this protection circuit is comprised of one field transistor which, in entirety, triggers into snapback at the same time, the same advantages as those of the first embodiment can be acquired.

Although an N-channel MOS transistor or an N-channel field transistor is used as a buffer transistor which constitutes the protection circuit according to the first and second embodiment, the type of the transistor in use is not particularly limited in this invention. For example, the same advantages as those of the first embodiment can be obtained by using a P-channel MOS transistor or a P-channel field transistor. Further, the gate electrode of the protection circuit may be shaped so that crests and troughs are bent in rectangular shapes or have curved shapes in a planar view. With the crests and troughs bent in rectangular shapes, however, an electric field is concentrated on the rectangular portions, making the transistor easier to break. To prevent the breaking of the transistor, therefore, it is preferable that each of the crests and troughs is comprised of a plurality of corner portions of dull angles. Furthermore, the crests and troughs, if formed arcuate, can prevent the concentration of an electric field more effectively.

What is claimed is:

1. A semiconductor device having a protection circuit comprising:
   a substrate;
   an internal circuit formed at a surface of said substrate; and
   a protection circuit, connected to an input end of said internal circuit, for preventing said internal circuit from destroying due to an excess voltage, said protection circuit having,
      a gate electrode formed on said substrate in a shape zigzagging in a wavelike form in a planar view and set to a ground potential,
      a first diffusion layer connected to said input end of said internal circuit and formed in one of two diffusion regions of said surface of said substrate, said regions being defined by said gate electrode, and
      a second diffusion layer set to said ground potential and formed in the other one of said two diffusion regions, one of said first diffusion layer and said second diffusion layer being a source diffusion layer, the other region being a drain diffusion layer.

2. The semiconductor device according to claim 1, wherein said gate electrode has a waveform shape having crests and troughs alternately appearing in a planar view, and each of said crests and troughs is comprised of a plurality of corner portions of dull angles.

3. The semiconductor device according to claim 1, wherein said gate electrode has a waveform shape having crests and troughs alternately appearing in a planar view, and said crests and troughs are arcuate.

4. The semiconductor device according to claim 1, further comprising:
   a source electrode electrically connected to said source diffusion layer; and
   a drain electrode electrically connected to said drain diffusion layer.

5. The semiconductor device according to claim 4, wherein said source electrode and said drain electrode are formed of metal.

6. A semiconductor device having a protection circuit comprising:
   a substrate;
   an internal circuit formed at a surface of said substrate; and
   a protection circuit, connected to an output end of said internal circuit, for preventing said internal circuit from destroying due to an excess voltage, said protection circuit having,
      a gate electrode formed on said substrate in a shape zigzagging in a wavelike form in a planar view and connected to an output end of said internal circuit,
      a first diffusion layer applied with an external source voltage and formed in one of two diffusion regions of said surface of said substrate, said regions being defined by said gate electrode, and
      a second diffusion layer set to a ground potential and formed in the other one of said two diffusion regions, one of said first diffusion layer and said second diffusion layer being a source diffusion layer, the other region being a drain diffusion layer.

7. The semiconductor device according to claim 6, wherein said gate electrode has a waveform shape having crests and troughs alternately appearing in a planar view, and each of said crests and troughs is comprised of a plurality of corner portions of dull angles.

8. The semiconductor device according to claim 6, wherein said gate electrode has a waveform shape having crests and troughs alternately appearing in a planar view, and said crests and troughs are arcuate.

9. The semiconductor device according to claim 6, further comprising:
- a source electrode electrically connected to said source diffusion layer; and
- a drain electrode electrically connected to said drain diffusion layer.

10. The semiconductor device according to claim 9, wherein said source electrode and said drain electrode are formed of metal.

11. A semiconductor device having a protection circuit comprising:
- a substrate;
- an internal circuit formed at a surface of said substrate; and
- a protection circuit, connected to an input end of said internal circuit, for preventing said internal circuit from destroying due to an excess voltage, said protection circuit having,
  - a field insulator film formed at said surface of said substrate in a shape zigzagging in a wavelike form in a planar view,
  - a gate electrode formed on said field insulator film and set to a ground potential,
  - a first diffusion layer connected to an input end of said internal circuit and formed in one of two diffusion regions of said surface of said substrate, said regions being defined by said field insulator film, and
  - a second diffusion layer set to said ground potential and formed in the other one of said two diffusion regions, one of said first diffusion layer and said second diffusion layer being a source diffusion layer, the other region being a drain diffusion layer.

12. The semiconductor device according to claim 11, further comprising:
- a source electrode electrically connected to said source diffusion layer; and
- a drain electrode electrically connected to said drain diffusion layer, said gate electrode being formed integral with one selected from a group of said source electrode and said drain electrode.

13. The semiconductor device according to claim 12, wherein said source electrode, said drain electrode and said gate electrode are formed of metal.

14. The semiconductor device according to claim 11, wherein said gate electrode has a waveform shape having crests and troughs alternately appearing in a planar view, and each of said crests and troughs is comprised of a plurality of corner portions of dull angles.

15. The semiconductor device according to claim 11, wherein said gate electrode has a waveform shape having crests and troughs alternately appearing in a planar view, and said crests and troughs are arcuate.

* * * * *